(12) United States Patent
Kim et al.

(10) Patent No.: US 8,796,087 B2
(45) Date of Patent: *Aug. 5, 2014

(54) METHOD OF FABRICATING A SEMICONDUCTOR DEVICE

(71) Applicant: Samsung Electronics Co., Ltd., Suwon-si (KR)

(72) Inventors: Weon-Hong Kim, Suwon-si (KR); Min-Woo Song, Seongnam-si (KR); Jung-Min Park, Ansan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/923,470

(22) Filed: Jun. 21, 2013

(65) Prior Publication Data

US 2013/0280881 A1 Oct. 24, 2013

Related U.S. Application Data

(62) Division of application No. 12/656,746, filed on Feb. 16, 2010, now Pat. No. 8,471,359.

(30) Foreign Application Priority Data

Feb. 16, 2009 (KR) .................. 10-2009-0012501

(51) Int. Cl.
*H01L 21/8242* (2006.01)
(52) U.S. Cl.
USPC .......... 438/239; 438/171; 438/190; 438/210; 438/238; 438/253; 257/68; 257/71; 257/296; 257/516; 257/532

(58) Field of Classification Search
None
See application file for complete search history.

(56) References Cited

U.S. PATENT DOCUMENTS

| 7,101,811 | B2 | 9/2006 | Kuse et al. | |
|---|---|---|---|---|
| 2004/0217478 | A1 | 11/2004 | Yamamoto et al. | |
| 2005/0268853 | A1* | 12/2005 | Yamamoto et al. | 118/726 |
| 2006/0046380 | A1* | 3/2006 | Choi et al. | 438/238 |
| 2006/0102983 | A1 | 5/2006 | Iijima | |
| 2007/0049043 | A1 | 3/2007 | Muthukrishnan et al. | |
| 2007/0102742 | A1 | 5/2007 | Kil et al. | |
| 2007/0284677 | A1 | 12/2007 | Chang et al. | |
| 2009/0184356 | A1* | 7/2009 | Brodsky et al. | 257/301 |

FOREIGN PATENT DOCUMENTS

JP 2008-072001 A 3/2008

* cited by examiner

*Primary Examiner* — Steven Loke
*Assistant Examiner* — Cuong B Nguyen
(74) *Attorney, Agent, or Firm* — Lee & Morse, P.C.

(57) ABSTRACT

A semiconductor device including a substrate; a bottom electrode on the substrate; a first dielectric layer on the bottom electrode, the first dielectric layer including a first metal oxide including at least one of Hf, Al, Zr, La, Ba, Sr, Ti, and Pb; a second dielectric layer on the first dielectric layer, the second dielectric layer including a second metal oxide including at least one of Hf, Al, Zr, La, Ba, Sr, Ti, and Pb, wherein the first metal oxide and the second metal oxide are different materials; a third dielectric layer on the second dielectric layer, the third dielectric layer including a metal carbon oxynitride; and an upper electrode on the third dielectric layer.

4 Claims, 6 Drawing Sheets

METHOD OF FABRICATING A SEMICONDUCTOR DEVICE

CROSS REFERENCE TO RELATED APPLICATION

This is a divisional application based on pending application Ser. No. 12/656,746, filed Feb. 16, 2010, the entire contents of which is hereby incorporated by reference.

BACKGROUND

1. Field

Embodiments relate to a semiconductor device and a method of fabricating the same.

2. Description of the Related Art

Due to high degrees of integration and storage capability of semiconductor devices, a thin layer having high-k has recently been used for, e.g., a gate dielectric layer of a transistor, a dielectric layer of a capacitor, or a gate dielectric layer of a non-volatile memory device. By using such a high-k thin layer, a thin Equivalent Oxide Thickness (EOT) may be maintained and thus leakage current of the thin layer may be greatly reduced.

SUMMARY

Embodiments are directed to a semiconductor device and a method of fabricating the same, which represent advances over the related art.

It is a feature of an embodiment to provide a semiconductor device with improved reliability.

At least one of the above and other features and advantages may be realized by providing a semiconductor device including a substrate; a bottom electrode on the substrate; a first dielectric layer on the bottom electrode, the first dielectric layer including a first metal oxide including at least one of Hf, Al, Zr, La, Ba, Sr, Ti, and Pb; a second dielectric layer on the first dielectric layer, the second dielectric layer including a second metal oxide including at least one of Hf, Al, Zr, La, Ba, Sr, Ti, and Pb, wherein the first metal oxide and the second metal oxide are different materials; a third dielectric layer disposed on the second dielectric layer, the third dielectric layer including a metal carbon oxynitride; and an upper electrode disposed on the third dielectric layer.

The metal carbon oxynitride may be represented by Chemical Formula 1:

$$M_{(1-x-y-z)}O_xN_yC_z \qquad (1),$$

in Chemical Formula 1, M may include at least one of Hf, Al, Zr, La, Ba, Sr, Ti, and Pb, x may be about 0.4 to about 0.8, and y and z may each be about 0.05 or less.

A thickness of the first dielectric layer may be greater than a thickness of the third dielectric layer.

The first dielectric layer may include zirconium oxide and the second dielectric layer may include aluminum oxide.

The third dielectric layer may include zirconium carbon oxynitride.

A thickness of the first dielectric layer may be greater than a thickness of the third dielectric layer.

A thickness of the first dielectric layer may be greater than a thickness of the third dielectric layer.

At least one of the above and other features and advantages may also be realized by providing a method of fabricating a semiconductor device, the method including providing a substrate; forming a bottom electrode on the substrate; forming a first dielectric layer on the bottom electrode such that the first dielectric layer includes a first metal oxide including at least one of Hf, Al, Zr, La, Ba, Sr, Ti, and Pb; forming a second dielectric layer on the first dielectric layer such that the second dielectric layer includes a second metal oxide including at least one of Hf, Al, Zr, La, Ba, Sr, Ti, and Pb and the first metal oxide and the second metal oxide include different materials; forming a third dielectric layer on the second dielectric layer such that the third dielectric layer includes a metal carbon oxynitride; and forming an upper electrode on the third dielectric layer.

Forming the third dielectric layer may include providing a metal precursor to the substrate including the second dielectric layer such that the metal precursor is adsorbed on the second dielectric layer, supplying a first purge gas to remove un-adsorbed metal precursor, supplying an oxidation gas, supplying a second purge gas to remove un-reacted oxidation gas, performing a plasma treatment while nitridation gas is supplied, and supplying a third purge gas to remove un-reacted nitridation gas.

When providing the metal precursor, supplying the first purge gas, supplying the oxidation gas, supplying the second purge gas, performing the plasma treatment while the nitridation gas is supplied are defined as a stacking layer process, and forming the third dielectric layer with the metal carbon oxynitride layer includes repeating the stacking layer process multiple times, at least two stacking layer processes among the multiple times stacking layer processes may be performed with different amount and pressure of the oxidation gas and with different amount and pressure of the nitridation gas.

The first dielectric layer may include zirconium oxynitride, the second dielectric layer may include aluminum oxide, and the third dielectric layer may include zirconium carbon oxynitride.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
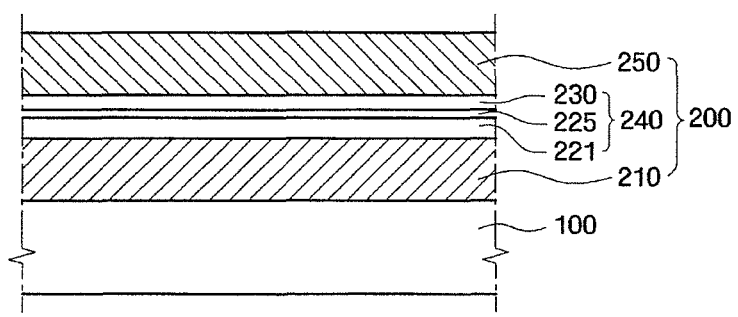
FIG. 1 illustrates a sectional view of semiconductor device according to an embodiment.

Korean Patent Application No. 10-209-0012501, filed on Feb. 16, 2009, in the Korean Intellectual Property Office, and entitled: "Semiconductor Device and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected to" another element, it can be connected or coupled to the other element or intervening elements may be present, unless otherwise explicitly stated. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

Hereinafter, referring to FIG. 1, a semiconductor device according to an embodiment is described. FIG. 1 illustrates a sectional view of a semiconductor device according to an embodiment. Referring to FIG. 1, a capacitor 200 may be formed on a substrate 100.

The substrate 100 may include, e.g., a silicon substrate, a SOI (Silicon On Insulator) substrate, a gallium arsenide substrate, a silicon germanium, a ceramic substrate, a quartz substrate, and/or a glass substrate for display. In addition, the substrate 100 may be, e.g., a p-type substrate, and although not illustrated in the drawings, a substrate on which a p-type epitaxial layer is grown may be used.

Although not illustrated in the drawings, e.g., transistors, interlayer dielectric layers, contact holes, and metal interconnects, may be formed on the substrate 100.

The capacitor 200 may include, e.g., a bottom electrode 210, a multi-layer dielectric layer 240, and an upper electrode 250.

The bottom electrode 210, may include, e.g., TiN, TiAlN, TaN, W, WN, Ru, $RuO_2$, $SrRuO_3$, Ir, $IrO_2$, and/or Pt. Although not illustrated in the drawings, the bottom electrode 210 may be connected to a conductive region, e.g., a source/drain region of a transistor formed on the substrate 100, through a contact hole.

The multi-layer dielectric layer 240 may be formed on the bottom electrode 210. The multi-layer dielectric layer 240 may include, e.g., a first dielectric layer 221, a second dielectric layer 225, and a third dielectric layer 230.

The first and the second dielectric layers 221 and 225 may be stacked on the bottom electrode 210. The first dielectric layer 221 may include a first metal oxide including, e.g., Hf, Al, Zr, La, Ba, Sr, Ti, and/or Pb. The second dielectric layer 225 may include a second metal oxide including, e.g., Hf, Al, Zr, La, Ba, Sr, Ti, and/or Pb. In an implementation, the first metal oxide of the first dielectric layer 221 and the second metal oxide of the second dielectric layer 225 may be different materials. The first dielectric layer 221 may be, e.g., a zirconium oxide layer ($ZrO_2$), formed by oxidation of zirconium (Zr). The second dielectric layer 225 may be, e.g., an aluminum oxide layer ($Al_2O_3$), formed by oxidation of aluminum (Al). Here, when the first dielectric layer 221 is a zirconium oxide layer and the second dielectric layer 225 is an aluminum oxide layer, a thickness of the zirconium oxide layer may be greater than a thickness of the aluminum oxide layer. In an implementation, the thickness of the first dielectric layer 221 may be, e.g., about 30 Å to about 50 Å, and the thickness of the second dielectric layer 225 may be, e.g., about 3 Å to about 7 Å.

The third dielectric layer 230 may be, e.g., a metal carbon oxynitride layer, formed on the second dielectric layer 225. The metal carbon oxynitride may be represented by Chemical Formula 1:

$$M_{(1-x-y-z)}O_xN_yC_z \qquad (1).$$

In Chemical Formula 1, M may include, e.g., Hf, Al, Zr, La, Ba, Sr, Ti, and/or Pb. Further, in Chemical Formula 1, y and z may be about 0.05 or less and x may be about 0.4 to about 0.8. In an implementation, 1-x-y-z may be about 0.2 to about 0.4. In other words, the metal carbon oxynitride may include carbon and nitrogen each in an amount of up to about 5 mol %, based on the total moles of M, O, N, and C. Accordingly, a nitrogen and carbon content in the third dielectric layer 230 may be relatively small.

As a result, since the third dielectric layer 230 may include relatively small amount of carbon, permittivity may be improved and undesirable leakage current may be reduced. Also, since the third dielectric layer 230 may include a relatively small amount of nitrogen, quality may be improved and deterioration of the capacitor 200 may be avoided due to, e.g., deterioration of the bottom electrode 210 by an oxidation process to form the first and/or the second dielectric layers 221 and 225. Specifically, nitrogen contained in the third dielectric layer 230 may move from an area adjacent to the upper electrode 250 to the bottom electrode 210, and may deoxidize the bottom electrode 210 oxidized during the oxidation process used to form the first and/or the second dielectric layers 221 and 225. Again, deterioration of capacitor characteristics may thereby be prevented. A more detailed description is included below referring to FIGS. 9A through 10.

In an implementation, the third dielectric layer 230 may be, e.g., zirconium carbon oxynitride, $Zr_{(1-x-y-z)}O_xN_yC_z$, formed by using zirconium. The thickness of third dielectric layer 230 may be, e.g., about 10 Å to about 50 Å.

According to an embodiment, when the first, the second, and the third dielectric layers 221, 225, and 230 include zirconium oxide, aluminum oxide, and zirconium carbon oxynitride, respectively, to improve permittivity of the multi-layer dielectric layer 240 and electrical characteristics of the capacitor 200, the thickness of the first dielectric layer 221 may be greater than the thickness of the third dielectric layer 230. Since the third dielectric layer 230 may include nitrogen and carbon, it may have relatively inferior permittivity and layer characteristics, compared to the first dielectric layer 221.

The upper electrode 250 may be formed on, and in contact with, the third dielectric layer 230. In an implementation, the upper electrode 250 may include, e.g., TiN, TiAlN, TaN, W, WN, Ru, RuO$_2$, SrRuO$_3$, Ir, IrO$_2$, and/or Pt. Although not illustrated in the drawings, the upper electrode 250 may be connected to metal interconnects formed on the substrate 100 through contact holes.

Therefore, a semiconductor device including the multi-layer dielectric layer 240 formed in a stack structure with the first, the second, and the third dielectric layers 221, 225, and 230 may not only avoid deterioration of the capacitor 200 due to oxidation of the bottom electrode 210, but may also improve reliability by reducing leakage current.

Hereinafter, referring to FIGS. 1 through 6, a method of fabricating a semiconductor device according to an embodiment is described.

Figure 2:
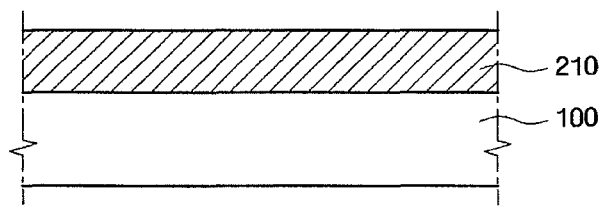
FIGS. 2 through 4 illustrate sectional views of stages in a method of fabricating a semiconductor device according to an embodiment.
Figure 3:
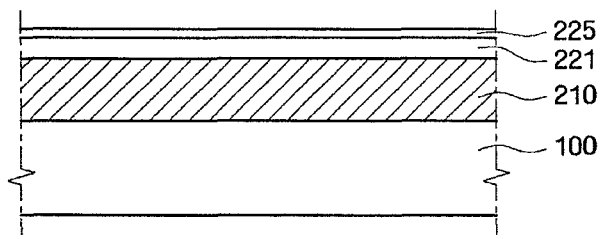
Figure 4:
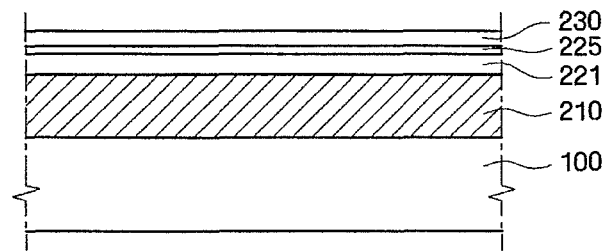
Figure 5:
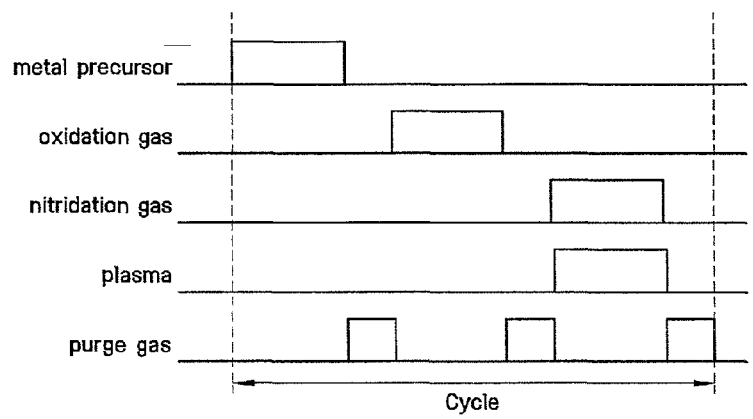
FIG. 5 illustrates a timing diagram of a method of forming a third dielectric layer in a method of fabricating a semiconductor device according to an embodiment.
Figure 6:
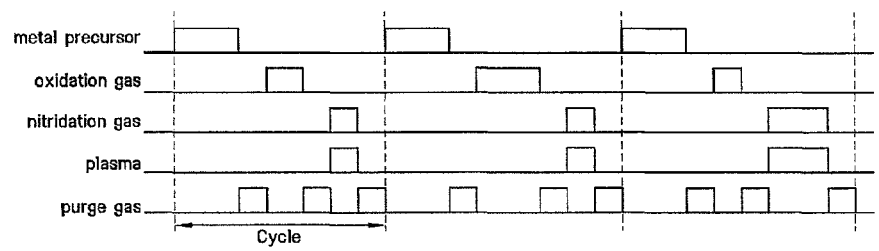
FIG. 6 illustrates a timing diagram of a method of forming a third dielectric layer in a method of fabricating a semiconductor device according to another embodiment.

FIGS. 2 through 4 illustrate sectional views of stages in a method of fabricating a semiconductor device according to an embodiment. FIG. 5 illustrates a timing diagram of a method of forming the third dielectric layer in a method of fabricating a semiconductor device according to an embodiment. FIG. 6 illustrates a timing diagram of a method of forming a third dielectric layer in a method of fabricating a semiconductor device according to another embodiment.

First, referring to FIG. 2, a bottom electrode 210 may be formed on a substrate 100. The bottom electrode 210 may include, e.g., TiN, TiAlN, TaN, W, WN, Ru, RuO$_2$, SrRuO$_3$, Ir, IrO$_2$, and/or Pt.

Referring to FIG. 3, first and a second dielectric layers 221 and 225 may be sequentially stacked on the bottom electrode 210. In an implementation, the first dielectric layer 221 may be formed as, e.g., a zirconium oxide (ZrO$_2$) layer, and the second dielectric layer 225 may be formed as, e.g., an aluminum oxide (Al$_2$O$_3$) layer.

In particular, the semiconductor substrate 100 including the bottom electrode 210 may be placed in a process chamber. Next, after setting a predetermined temperature and pressure, a zirconium precursor material may be supplied into the chamber. In an implementation, e.g., TEMAZ (Tetrakis Ethyl Methyl Amino Zirconium), TDMAZ (Tetrakis Di-Methyl Amino Zirconium), TDEAZ (Tetrakis Di-Ethyl Amino Zirconium), Zr(OtBu)$_4$, and/or ZrCl$_4$, may be used as the zirconium precursor material. Then, the zirconium precursor may be adsorbed on the bottom electrode 210.

Next, by supplying a purge gas, e.g., N$_2$, He, and/or Ar, into the chamber, remaining un-adsorbed zirconium precursor inside the chamber may be removed.

Then, an oxidation gas may be supplied into the chamber. The oxidation gas may include, e.g., O$_2$, O$_3$, H$_2$O, NO, NO$_2$, and/or N$_2$O. As the oxidation gas is supplied, plasma voltage may be applied inside the chamber to perform plasma treatment. When plasma is formed inside the chamber, the oxidation gas may become either plasma or remote-plasma, and a reaction of a layer to be formed may be accelerated and the layer may be more solidified. Thus, as the oxidation gas is supplied and plasma treatment is performed, the zirconium precursor adsorbed on the bottom electrode 210 may be oxidized to form a zirconium oxide layer.

Next, by supplying a purge gas, e.g., N$_2$, He, or Ar, into the chamber, remaining oxidation gas inside the chamber may be removed.

By repeating the steps above relating to the zirconium precursor a predetermined number of times, the first dielectric layer 221 including the zirconium oxide layer having a predetermined thickness on the bottom electrode 210 may be formed.

Then, an aluminum precursor material may be supplied into the chamber.

The aluminum precursor material may include, e.g., TMA (Tri Methyl Aluminum), DMAH (Di Methyl Aluminum Hydride), and/or DMAH-EPP (DiMethyl Aluminum Hydride Ethyl Piperidine). The aluminum precursor may be adsorbed on the first dielectric layer 221.

Next, after removing remaining un-adsorbed aluminum precursor inside the chamber by supplying a purge gas, e.g., N$_2$, He, and/or Ar, into the chamber, an oxidation gas may be supplied into the chamber and plasma treatment may be performed to form an aluminum oxide layer. Then, by supplying a purge gas, e.g., N$_2$, He, and/or Ar, into the chamber, remaining oxidation gas inside the chamber may be removed.

By repeating the steps above relating to the aluminum precursor a predetermined number of times, the second dielectric layer 225 including the aluminum oxide layer having a predetermined thickness may be formed on the first dielectric layer 221.

Referring to FIG. 4, a third dielectric layer 230 may be formed on the second dielectric layer 225. The third dielectric layer 230 may include, e.g., a metal carbon oxynitride layer. The metal carbon oxynitride may be represented by Chemical Formula 1:

$$M_{(1-x-y-z)}O_xN_yC_z \qquad (1).$$

In Chemical Formula 1, M may include, e.g., Hf, Al, Zr, La, Ba, Sr, Ti, and/or Pb. 1-x-y-z, x, y, and z, i.e., the metal, oxygen, nitrogen, and carbon content of the metal carbon oxynitride may be the same as described above. In other words, the metal carbon oxynitride may include carbon and nitrogen each in an amount of up to about 5 mol %, based on the total moles of M, O, N, and C. Referring to FIGS. 4 and 5, forming the third dielectric layer 230 on the second dielectric layer 225 is described in more detail.

After forming the second dielectric layer 225, a metal precursor material may be supplied to the chamber. Here, the metal precursor material may include, e.g., Hf, Al, Zr, La, Ba, Sr, Ti, and/or Pb. When the third dielectric layer 230 is a zirconium carbon oxynitride layer, e.g., TEMAZ, TDMAZ, TDEAZ, Zr(OtBu)$_4$, and/or ZrCl$_4$, may be used as the metal precursor material. When the third dielectric layer 230 is an aluminum carbon oxynitride layer, e.g., TMA, DMAH, and/or DrvlAH-EPP, may be used as the metal precursor material. The metal precursor may be adsorbed on the second dielectric layer 225.

Next, by supplying a purge gas, e.g., N$_2$, He, and/or Ar, into the chamber, remaining un-adsorbed metal precursor inside the chamber may be removed.

Then, an oxidation gas may be supplied to the chamber. The oxidation gas may include, e.g., O$_2$, O$_3$, H$_2$O, NO, NO$_2$, and/or N$_2$O. Thus, the metal precursor adsorbed on the second dielectric layer 225 may be oxidized.

Next, by supplying a purge gas, e.g., $N_2$, He, and/or Ar, into the chamber, remaining un-reacted oxidation gas inside the chamber may be removed.

Then, a nitridation gas may be supplied to the chamber. The nitridation gas may include, e.g., $N_2$, $NH_3$, NO, and/or $N_2O$. As the nitridation gas is supplied, plasma voltage may be applied inside the chamber to perform a plasma treatment. That is, when nitridation gas is supplied and plasma treatment is performed, the metal precursor that was oxidized in the previous step may be nitrided to form the metal carbon oxynitride layer.

Next, by supplying a purge gas, e.g., $N_2$, He, and/or Ar, into the chamber, remaining un-reacted nitridation gas inside the chamber may be removed.

By repeating the steps above relating to the metal precursor a predetermined number of times, the third dielectric layer 230, which may be a metal carbon oxynitride layer, may be stacked on the second dielectric layer 225. In an implementation, by adjusting a number of repetitions, a thickness of third dielectric layer 230 may be controlled.

Therefore, in the method of fabricating the semiconductor device according to an embodiment, the third dielectric layer 230, as illustrated in FIG. 5, may be formed by the process sequence of: metal precursor supply→purge→oxidation gas supply→purge→nitridation gas supply and plasma treatment→purge. If the metal carbon oxynitride formed using the process sequence above is represented by Chemical Formula 1:

$$M_{(1-x-y-z)}O_xN_yC_z \quad (1),$$

x may be about 0.4 to about 0.8, and y and z may each be about 0.05 or less, thus the content of nitrogen and carbon in the third dielectric layer 230 may be relatively small. In other words, nitrogen and carbon may each be included in the metal carbon oxynitride in an amount of up to about 5 mol %, based on the total moles of M, O, N, and C. In an implementation, 1-x-y-z may be about 0.2 to about 0.4.

Specifically, in the method of fabricating the semiconductor device according to the present embodiment, the content of nitrogen and carbon may be relatively small compared to other processes, e.g., first supplying a nitridation gas and then supplying oxidation gas after plasma treatment. Thus, since the oxidation gas may be supplied relatively early, carbon and nitrogen in the metal precursor may be consumed by the oxidation gas and thus the carbon and nitrogen content of the metal carbon oxynitride may be small. Also, since reactive sites of the precursor may be first bonded with oxygen, a relatively small number of reactive sites may remain when the nitridation gas is supplied. As a result, in the metal carbon oxynitride layer, nitrogen content may be relatively small.

As a result, since the third dielectric layer 230 according to an embodiment may include a relatively small amount of carbon, permittivity may be improved and leakage current may be reduced. Also, since the third dielectric layer 230 may include a relatively small amount of nitrogen, layer quality may be improved and deterioration of the capacitor 200 due to deterioration of the bottom electrode 210 during the oxidation process to form the first and/or the second dielectric layer 221 and 225 may be prevented. ALD (Atomic Layer Deposition) or PEALD (Plasma Enhanced ALD) may be used to form the first, the second, and the third dielectric layers 221, 225, and 230. Also, the first, the second, and the third dielectric layers 221, 225, and 230 may be formed in-situ in the same chamber.

Next, again referring to FIG. 1, the capacitor 200 may be completed by forming an upper electrode 250 on the third dielectric layer 230. The upper electrode 250, may include, e.g., TiN, TiAlN, TaN, W, WN, Ru, $RuO_2$, $SrRuO_3$, Ir, $IrO_2$, and/or Pt.

As described above, FIG. 6 illustrates a timing diagram of a method of forming the third dielectric layer in a method of fabricating a semiconductor device according to another embodiment.

Referring to FIGS. 1 through 6, the method of fabricating the semiconductor device according to the present embodiment may be identical to the previous embodiment, except that when forming the metal carbon oxynitride of the third dielectric layer 230, the present embodiment may not apply identical conditions to all cycles to form metal carbon oxynitride. Thus, in the present embodiment, the metal carbon oxynitride of third dielectric layer 230 may be formed by multiple stacking layer processes. Further, during the multiple stacking layer processes at least two processes may be performed with different amounts and pressures of oxidation gas and nitridation gas.

Specifically, as illustrated in FIG. 6, in the present embodiment, when each atomic layer is formed by performing one cycle, i.e., one stacking layer process, which includes a process sequence of, e.g., metal precursor supply→a first purge→oxidation gas supply→a second purge→nitridation gas supply and plasma treatment→a third purge, each cycle may be performed with different type, quantity, and/or pressure of oxidation gas and nitridation gas. As a result, the metal carbon oxynitride formed during each cycle, which may be represented by Chemical Formula 1, may have different contents of oxygen, nitrogen, and carbon. Such metal carbon oxynitride layers may have atomic layers where the contents of oxygen, carbon, and nitrogen in each atomic layer are different in each atomic layer. As a result, although crystal growth may occur in one of the atomic layers, adjacent layers may prevent the crystal growth and formation of large crystals may be avoided. Therefore, in the third dielectric layer 230, formation of a leakage current path may be prevented.

Among the multiple layer stacking process cycles, at least two cycles may be performed using different types, quantity, and pressure of the oxidation gas and nitridation gas. Thus, the third dielectric layer 230 may be formed with different process conditions for all cycles, or by performing different group processes consisting of multiple cycles repeatedly.

As described above, a capacitor included in the semiconductor device according to an embodiment may include various capacitors that may be used in semiconductor devices, e.g., a flat-type capacitor and a cylinder-type capacitor. Hereinafter, by referring to FIGS. 7 and 8, a semiconductor device according to an embodiment is described.

Figure 7:
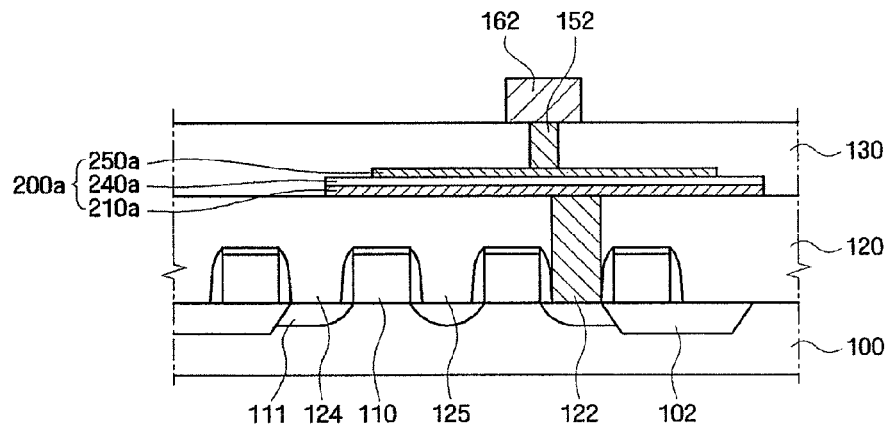
FIGS. 7 and 8 illustrate sectional views of semiconductor devices according to embodiments.

FIG. 7 illustrates a semiconductor device including a flat-type capacitor according to an embodiment.

Referring to FIG. 7, a device isolation layer 102 may be formed in a substrate 100 to isolate an active region and a field region. Gate electrodes 110 may be disposed on the substrate 100. Also, a source/drain region 111, which may be aligned with the gate electrode 110, may be disposed in the substrate 100. A first interlayer dielectric layer 120 may be formed on the substrate 100 and the gate electrodes 110.

A first contact 122 may be formed in the first interlayer dielectric layer 120 on the source/drain region 111. The first contact 122 may electrically connect the source/drain region 111 in the substrate 100 to a bottom electrode 210a of a flat-type capacitor 200a. Also, a bit line contact (not illustrated), which may be electrically connected to another source/drain region 111 of the substrate 100, may be formed in the first interlayer dielectric layer 120.

A second interlayer dielectric layer 130 may be formed on the first interlayer dielectric layer 120. The flat-type capacitor 200a, which may be electrically connected to the first contact 122, may be formed in the second interlayer dielectric layer 130.

The flat-type capacitor 200a may include the bottom electrode 210a formed on the first contact 122, a multi-layer dielectric layer 240a, and an upper electrode 250a. The upper electrode 250a may be connected to a wire contact 152, which may connect a wire 162 to the upper electrode 250a. Here, the flat-type capacitor 200a may include the multi-layer dielectric layer 240a according to the previously described embodiment.

Figure 8:
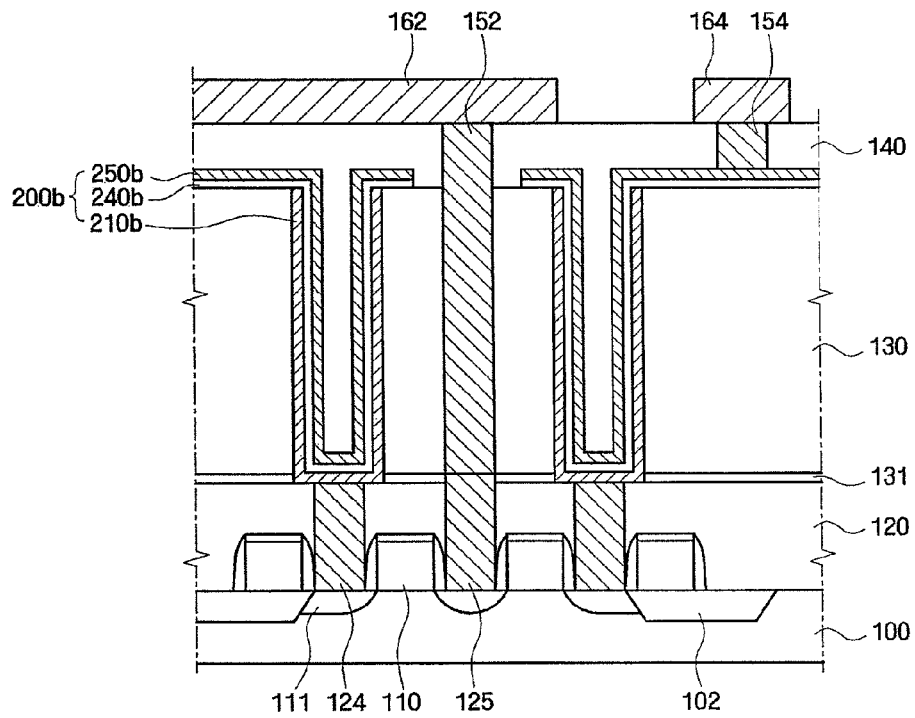

FIG. 8 illustrates a semiconductor device including a cylinder-type capacitor according to an embodiment.

Referring to FIG. 8, a device isolation layer 102 may be formed in a substrate 100 to isolate an active region and a field region. Gate electrodes 110 may be disposed on the substrate 100. Also, a source/drain region 111 aligned with the gate electrode 110 may be formed in the substrate 100.

A first interlayer dielectric layer 120 may be formed on the substrate 100 and the gate electrodes 110. A first contact 124, which may electrically connect the source/drain region 111 to a bottom electrode 210b of a cylinder-type capacitor 200b may be formed in the first interlayer dielectric layer 120. Also, a first bit line contact 125, which may be electrically connected to another source/drain region 111 of the substrate 100, may be formed in the first interlayer dielectric layer 120.

An etch stop layer 131 may be formed on the first interlayer dielectric layer 120. A second interlayer dielectric layer 130 may be formed on the etch stop layer 131. A second bit line contact 152 connected to a bit line 162 may be formed in the second interlayer dielectric layer 130 on the first bit line contact 125.

The cylinder-type capacitor 200b may be formed on the first contact 124. The cylinder-type capacitor 200b may include the bottom electrode 210b, a multi-layer dielectric layer 240b, and an upper electrode 250b. The upper electrode 250b may be connected to a wire contact 154, which may connect a wire 164 to the upper electrode 250b. Here, the cylinder-type capacitor 200b may include the multi-layer dielectric layer 240b according to an embodiment.

More detailed descriptions of the embodiments are explained by using the following specific experimental examples, and explanation for the content not described here is skipped since it is obvious for those skilled in the art.

EXPERIMENTAL EXAMPLE 1

As described below, experiments were conducted on first and second examples and a first comparison example. For each of the first and second example and the first comparison example, the bottom electrode and the upper electrode were identically formed with TiN, while the multi-layer dielectric layer was formed differently.

In the first example the multi-layer dielectric layer was formed by sequentially stacking a zirconium oxide layer, an aluminum oxide layer, and a zirconium carbon oxynitride layer on the bottom electrode. Specifically, the zirconium oxide layer was formed by repeating 42 times, a process cycle, which included: metal precursor (TEMAZ) supply→purge (Ar)→oxidation gas ($O_2$) supply and plasma treatment→purge (Ar). The aluminum oxide layer was formed by repeating 3 times, a process cycle, which included: metal precursor (TMA) supply→purge (Ar) oxidation gas ($O_2$) supply and plasma treatment→purge (Ar). The zirconium carbon oxynitride layer was formed by repeating 22 times, a process cycle, which included metal precursor (TEMAZ) supply→purge (Ar)→oxidation gas ($O_2$) supply→purge (Ar)→nitridation gas ($NH_3$) supply and plasma treatment→purge (Ar). As a result, the EOT of the multi-layer dielectric layer was 9.8 Å.

In the second example, similar to the first example, a multi-layer dielectric layer was formed by sequentially stacking a zirconium oxide layer, an aluminum oxide layer, and a zirconium carbon oxynitride layer on the bottom electrode, except the number of repetitions of process cycles to form the zirconium carbon oxynitride layer were different. Specifically, in the second example, the zirconium carbon oxynitride layer was formed by repeating the process cycle used to form the zirconium carbon oxynitride in the first experimental example 30 times. As a result, the EOT of the multi-layer dielectric layer was 10.4 Å.

In the first comparison example, the multi-layer dielectric layer was formed by sequentially stacking a first zirconium oxide layer, an aluminum oxide layer, and a second zirconium oxide layer on the bottom electrode. Specifically, the first zirconium oxide layer and the aluminum oxide layer were stacked sequentially on the bottom electrode by using the identical method used in the first example. The second zirconium oxide layer was formed on the aluminum oxide layer the by repeating 14 times the process cycle used to form the zirconium oxide layer in the first example. As a result, the EOT of multi-layer dielectric layer was 10.4 Å.

Figure 9A:
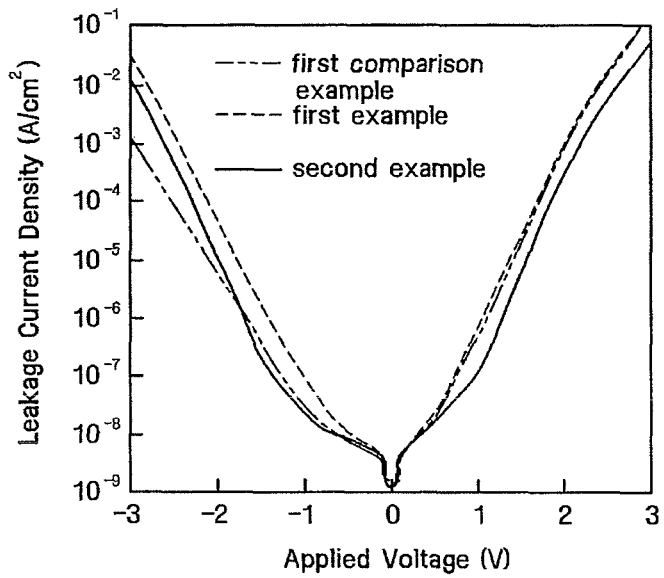
FIG. 9A through 10 illustrate graphs showing experimental results using the semiconductor devices of an embodiment.
Figure 9B:
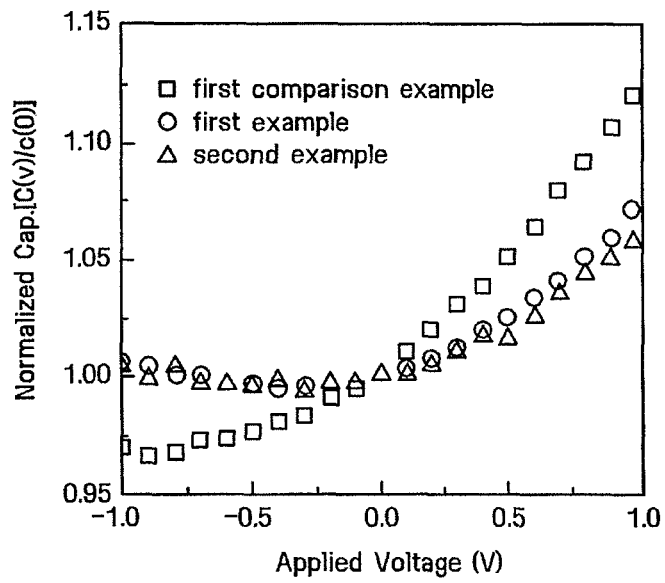

Next, while applying various voltages to the bottom electrodes and the upper electrodes, leakage current and capacitance were measured in the first and the second examples and the first comparison example. The results are illustrated in FIGS. 9A and 9B. Referring to FIG. 9A, the x-axis represents the voltage applied to each end of the bottom electrode and the upper electrode and the y-axis represents leakage current density with the unit of $A/cm^2$. Referring to FIG. 9B, the x-axis represents the voltage applied to each end of the bottom electrode and the upper electrode, and the y-axis represents the capacitance normalized by an applied voltage of 0 V.

First, referring to FIG. 9A, the first and the second examples exhibited improvement in leakage current characteristics compared to the first comparison example. Specifically, in the first and the second examples and the first comparison example, when the leakage current was 100 $nA/cm^2$, the voltages applied to each end of the bottom electrode and the upper electrode are summarized in Table 1.

TABLE 1

| First Example | Second Example | First Comparison Example |
|---|---|---|
| −1.0 V/0.7 V | −1.3 V/1.0 V | −1.3 V/0.7 V |

Referring to Table 1 above, in the second example having the same EOT (10.4 Å) as the first comparison example, since a leakage current of 100 $nA/cm^2$ occurred at higher voltage, it may be seen that electrical characteristics of the capacitor according to the second example were improved.

Next, referring to FIG. 9B, in the first and the second examples it may be seen that the capacitance remained relatively constant compared to the first comparison example. Specifically, in the first and the second examples and the first comparison example, a ratio of capacitance where a voltage of 0.6 V was applied to the bottom electrode and the upper electrode to capacitance where a voltage of −0.6 V was applied to the bottom electrode and the upper electrode is summarized in Table 2.

TABLE 2

| First Example | Second Example | First Comparison Example |
|---|---|---|
| 96.4% | 97.1% | 91.3% |

Referring to Table 2 above, since the first and second examples, where the zirconium carbon oxynitride was formed under the upper electrode, exhibited relatively constant capacitance, compared to the first comparison example where the zirconium oxide layer was formed under the upper electrode, it may be seen that electrical characteristics of capacitance were improved.

EXPERIMENTAL EXAMPLE 2

Experiments were conducted on the first and the second examples and the first comparison example, as well as second and third comparison examples. Here, in the second and third comparison examples, the bottom and the upper electrodes were formed with TiN, identical to the previous examples, with only the multi-layer dielectric layers formed differently.

In the second comparison example, the multi-layer dielectric layer was formed by stacking a zirconium carbon oxynitride layer, an aluminum oxide layer, and a zirconium oxide layer on the bottom electrode. Specifically, the zirconium carbon oxynitride layer was formed by repeating 22 times the cycle used to form the zirconium carbon oxynitride layer in the first example. The aluminum oxide layer was formed by repeating 3 times the cycle used to form the aluminum oxide layer in the first example. The zirconium oxide layer was formed by repeating 42 times the cycle used to form the zirconium oxide layer in the first example. The resulting EOT of the multi-layer dielectric layer was 11.9 Å.

In the third comparison example, after forming the identical multi-layer dielectric layer formed in the first comparison example, plasma treatment was performed for 1 minute while supplying $NH_3$ gas. Thus, the multi-layer dielectric layer in the first example was nitrified. The resulting EOT of the multi-layer dielectric layer was 10.3 Å.

Figure 10:
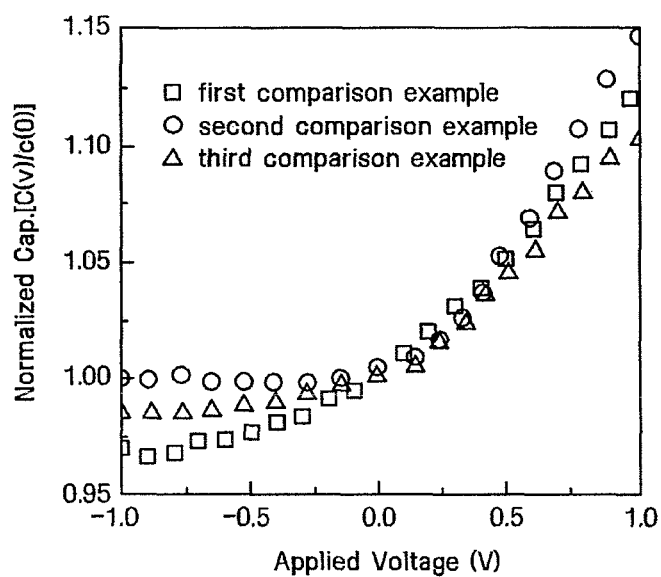

Next, while applying various voltages to the bottom electrode and the upper electrode, capacitance of the first and second examples and the first through third comparison examples were measured. Here, the results of the first through third comparison examples are illustrated in FIG. 10. In FIG. 10, the x-axis represents voltage applied to each end of the bottom electrode and the upper electrode and the y-axis represents the capacitance normalized by an applied voltage of 0 V.

Referring to FIGS. 9B and 10, in the first and second examples it may be seen that the capacitance remained relatively constant compared to the first through third comparison examples. Specifically, in the first and second examples and the first through the third comparison examples, a ratio of capacitance where a voltage of 0.6 V is applied to capacitance where a voltage of −0.6 V is applied to the bottom electrode and the upper electrode is summarized in Table 3.

TABLE 3

| First Example | Second Example | First Comparison Example | Second Comparison Example | Third Comparison Example |
|---|---|---|---|---|
| 96.4% | 97.1% | 91.3% | 93.0% | 93.1% |

Referring to Table 3, in the first and second examples that included the zirconium oxide layer, the aluminum oxide layer, and the zirconium carbon oxynitride layer in the multi-layer dielectric layer, it may be seen that capacitance remained relatively constant, compared to the second comparison example that included the zirconium carbon oxynitride layer, the aluminum oxide layer, and the zirconium oxide layer in the multi-layer dielectric layer. Also, in the second example it may be seen that capacitance remained relatively constant, compared to the third comparison example that formed the multi-layer dielectric layer followed by nitrification. Thus, in the first and the second examples it may be seen that capacitance remained relatively constant, compared to the first comparison example including the dielectric layer without nitrogen component, the second comparison example including the dielectric layer containing nitrogen component and different stack order, and the third comparison example that formed the multi-layer dielectric layer followed by nitrification. As a result, in the first and second examples, it may be seen that electrical characteristics of capacitance were improved compared to the first through third comparison examples.

In the descriptions above, although it was illustrated that the multi-layer dielectric layer was placed between the bottom electrode and the upper electrode and used as capacitor, it is not limited thereto. For example, in another implementation the multi-layer dielectric layer may be used as an inter-layer dielectric layer, e.g., a gate dielectric layer, tunnel dielectric layer, or block dielectric layer, of a flash memory device, which may be part of each memory cell. Specifically, in another implementation when the multi-layer dielectric layer formed with stack structure of the first through third dielectric layers is used in a semiconductor device, e.g., flash memory device, deterioration of semiconductor devices due to oxidation of a floating gate may be prevented, and reliability may be improved due to reduction of leakage current.

Figure 11:
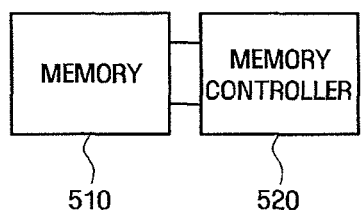
FIGS. 11 through 13 schematically illustrate examples of semiconductor devices fabricated according to an embodiment.
Figure 12:
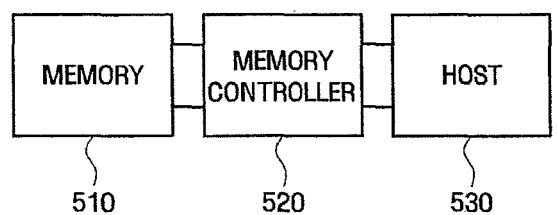
Figure 13:
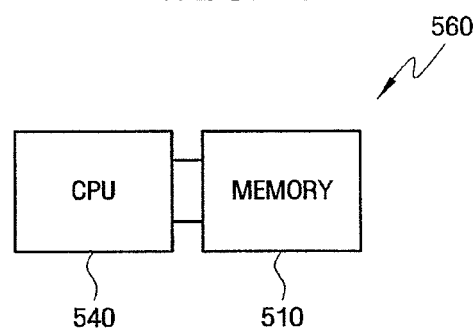

FIGS. 11 through 13 illustrate block diagrams of examples of semiconductor devices fabricated according to embodiments.

Referring to FIG. 11, a system according to an embodiment may include a memory 510 and a memory controller 520 connected to the memory 510. Here, DRAM (Dynamic Random Access Memory) and flash memory fabricated according to the previously described embodiments may be used for the memory 510.

The memory controller 520 may provide the memory 510 with input signals that may control operations of the memory 510, e.g., command signals and address signals to control read operations and write operations. In the logic circuit of the memory controller 520, capacitors formed according to an embodiment or transistors that include the multi-layer dielectric layer as gate dielectric layer formed according to an embodiment may be used.

The system, may be used in, e.g., electronic devices such as cell phone, two-way communication system, one way pager, two-way pager, personal communication system, portable computer, PDA (Personal Digital Assistant), audio and/or video player, digital and/or video camera, navigation system, and GPS (Global Positioning System).

Referring to FIG. 12, a system according to another embodiment may include a memory 510, a memory controller 520, and a host system 530. Here, the host system 530 may be connected to the memory controller 520 through a bus and may provide the memory controller 520 with control signals to enable the memory controller 520 to control operations of the memory 510. Such host system 530 may be, e.g., a processing system used in cell phone, two-way communication system, one way pager, two-way pager, personal communication system, portable computer, PDA (Personal Digital Assistant), audio and/or video player, digital and/or video camera, navigation system, and GPS (Global Positioning System).

Although FIG. 12 shows the memory controller 520 in between the memory 510 and the host system 530, it is not limited thereto. In an implementation, the memory controller 520 may be selectively omitted in a system.

Referring to FIG. 13, a system according to another embodiment may be, e.g., a computer system 560 that includes a CPU (Central Processing Unit) 540 and a memory 510. In the computer system 560, the memory 510 may be connected to the CPU 540 directly or through typical computer bus architecture and may be DRAM or non-volatile memory. Such memories may be used to store OS (Operation System) instruction set, BIOS (Basic Input/Output Start up) instruction set, and ACPI (Advanced Configuration and Power Interface) instruction set, or can be used as mass storage device such as SSD (Solid State Disk). Also, in the logic circuit of the CPU 540 capacitors formed according to an embodiment or transistors that use the multi-layer dielectric layer as gate dielectric layer formed according to an embodiment may be used. Although in FIG. 13 all the components included in the computer system 560 are not illustrated, it is not limited thereto. Also, although in FIG. 11 the memory controller 520 is omitted between the memory 510 and the CPU 540, the memory controller 520 may be placed between the memory 510 and the CPU 540 in another embodiment.

By using a high-k material, a metal oxide layer can be used as a capacitor dielectric layer. During a fabrication process of the metal oxide layer as a dielectric layer according to an embodiment, a bottom electrode may not be oxidized. Accordingly, electrical characteristics of the capacitor may not be deteriorated.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
   providing a substrate;
   forming a bottom electrode on the substrate;
   forming a first dielectric layer on the bottom electrode such that the first dielectric layer includes a first metal oxide including at least one of Hf, Al, Zr, La, Ba, Sr, Ti, and Pb;
   forming a second dielectric layer on the first dielectric layer such that the second dielectric layer includes a second metal oxide including at least one of Hf, Al, Zr, La, Ba, Sr, Ti, and Pb and the first metal oxide and the second metal oxide include different materials;
   forming a third dielectric layer on the second dielectric layer such that the third dielectric layer includes a metal carbon oxynitride; and
   forming an upper electrode on the third dielectric layer,
   wherein the metal carbon oxynitride is represented by Chemical Formula 1:

$$M_{(1-x-y-z)}O_xN_yC_z \qquad (1),$$

in Chemical Formula 1, M includes at least one of Hf, Al, Zr, La, Ba, Sr, Ti, and Pb, x is about 0.4 to about 0.8, and y and z are each about 0.05 or less.

2. The method as claimed in claim 1, wherein forming the third dielectric layer includes:
   providing a metal precursor to the substrate including the second dielectric layer such that the metal precursor is adsorbed on the second dielectric layer,
   supplying a first purge gas to remove un-adsorbed metal precursor,
   supplying an oxidation gas,
   supplying a second purge gas to remove un-reacted oxidation gas,
   performing a plasma treatment while nitridation gas is supplied, and
   supplying a third purge gas to remove un-reacted nitridation gas.

3. The method as claimed in claim 2:
   wherein, when providing the metal precursor, supplying the first purge gas, supplying the oxidation gas, supplying the second purge gas, performing the plasma treatment while the nitridation gas is supplied are defined as a stacking layer process, and
   forming the third dielectric layer with the metal carbon oxynitride layer includes repeating the stacking layer process multiple times,
   at least two stacking layer processes among the multiple times stacking layer processes are performed with different amount and pressure of the oxidation gas and with different amount and pressure of the nitridation gas.

4. The method as claimed in claim 1, wherein the first dielectric layer includes zirconium oxynitride, the second dielectric layer includes aluminum oxide, and the third dielectric layer includes zirconium carbon oxynitride.

* * * * *